(12) United States Patent
Tonda et al.

(10) Patent No.: US 6,529,411 B2
(45) Date of Patent: Mar. 4, 2003

(54) REFERENCE VOLTAGE GENERATOR CIRCUIT FOR NONVOLATILE MEMORY

(75) Inventors: Yasuhiro Tonda, Kanagawa (JP); Gou Tamura, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/997,192

(22) Filed: Nov. 29, 2001

(65) Prior Publication Data

US 2002/0086474 A1 Jul. 4, 2002

(30) Foreign Application Priority Data

Nov. 29, 2000 (JP) .......................................... 2000-362169

(51) Int. Cl.[7] ............................................... G11C 11/34

(52) U.S. Cl. ................................ 365/185.18; 365/189.09

(58) Field of Search ........................ 365/185.18, 189.09

(56) References Cited

U.S. PATENT DOCUMENTS 6,356,064 B1 * 3/2002 Tonda ......................... 323/313

* cited by examiner

Primary Examiner—M. Tran
(74) Attorney, Agent, or Firm—Katten Muchin Zavis Rosenman

(57) ABSTRACT

A reference voltage generator circuit comprises a band gap circuit and a level correction regulator circuit. The band gap circuit generates output voltages REF 1, REF 2 having temperature dependence according to each of the write/erase mode and verify/read mode by setting the resistance values of resistors, and one of the output voltages is selected by a transfer gate and is regarded as REF. The level correction regulator circuit generates, based on the output REF, an output voltage OUT (reference voltage) on a level which is required for each mode. By virtue of the above construction, a level correction regulator circuit and one band gap circuit can constitute a reference voltage generator circuit for a nonvolatile memory which can realize temperature characteristics according to each mode while reducing the layout area.

9 Claims, 7 Drawing Sheets

REF, REF1, REF2 OUTPUT VOLTAGE
Sref, Sref1, Sref2 VOLTAGE DROP
VF FORWARD VOLTAGE
R1, R2, R3 VALUE OF RESISTANCE
21, 22, 23, 34 P-TYPE TRANSISTOR
24, 26 N-TYPE TRANSISTOR
25, 27, 28, 35 RESISTOR
29 DIODE
30, 31, 36, 37 TRANSFER GATE
39 OUTPUT
40 WRITE TERMINAL
41 VERIFY TERMINAL
42 OUTPUT TERMINAL

REFERENCE VOLTAGE GENERATOR CIRCUIT FOR NONVOLATILE MEMORY

FIELD OF THE INVENTION

The invention relates to a reference voltage generator circuit for a nonvolatile memory, and more particularly to a reference voltage generator circuit for a nonvolatile memory, which, in generating each voltage for write, erase, and verification, can provide temperature characteristics depending upon each operation mode (write/erase, verification/read) by a single band gap circuit.

BACKGROUND OF THE INVENTION

In nonvolatile semiconductor memories, after erasure or writing, write verification or erase verification is carried out to examine whether or not information has been correctly erased or written, followed by reading operation. To this end, erase verify voltage (or write verify voltage) and read voltage used as gate voltage of the memory cell at the time of erase verification (or write verification) and reading are generated by a reference voltage generator circuit within the nonvolatile semiconductor memory. Voltage is selectively sent to each word line by performing switching among the erase verify voltage, the write verify voltage, and the read voltage.

FIG. 1 shows a specific example of a conventional reference voltage generator circuit for a nonvolatile memory.

A reference voltage generator circuit 500 comprises a band gap (BGR) circuit 510 for generating an output voltage REF and a write regulator circuit 520 connected to the band gap circuit 510. A voltage REF output from the band gap circuit 510 is input into the write regulator circuit 520, and the write regulator circuit 520 generates an output voltage OUT based on this REF. The band gap circuit 510 comprises P-type transistors 1, 4, 6, N-type transistors 2, 5, resistors 3, 7, and a diode 8.

Each source of the P-type transistors 1, 4, 6 is connected to a power line. The gate and the drain of the P-type transistor 1 are commonly bonded, and this portion is connected to the drain of the N-type transistor 2. The gate of the P-type transistor 4 is connected to the drain of the P-type transistor 1, and the drain of the P-type transistor 4 is connected to the drain of the N-type transistor 5. The P-type transistor 6 in its gate is connected to the drain of the P-type transistor 1. A constant current inversely proportional to the resistance value of the resistor 3 is output from the drain of the P-type transistor 6. The P-type transistors 1, 4, 6 are connected to the drain of the N-type transistor 2 in such a state that the gates of these transistors are connected parallel to one another. The source of the N-type transistor 2 is grounded through the resistor 3, and the gate of the N-type transistor 2 is connected to the gate of the N-type transistor 5. The source of the N-type transistor 5 is grounded, and the drain and the gate of the N-type transistor 5 each are connected to the source of the P-type transistor 6. A circuit composed of the resistor 7 and the diode 8, which are connected in series, is inserted between the drain of the P-type transistor 6 and the ground. An output voltage REF is output as an output of the band gap circuit 510 form the high potential side of the resistor 7.

In the band gap circuit 510, a constant current supplied to the series circuit composed of the resistor 7 and the diode 8 is inversely proportional to the resistance value of the resistor 3. For this reason, a voltage drop corresponding to the resistance value of the resistor 3, that is, a voltage drop VR set by the ratio of the resistance value R7 of the resistor 7 to the resistance value R3 of the resistor 3 (=reference value R7/resistance value R3), occurs in the resistor 7. The sum of the voltage drop VR and the forward voltage VF of the diode 8 (=VR+VF) is output as an output voltage REF.

The temperature dependency $\delta(REF)/\delta T$ of the output voltage REF is expressed by equation (1):

$$\delta(REF3)/\delta T=(k/q)\times ln[\{(W4/L4)\times(W2/L2)\}/\{(W1/L1)\times(W5/L5)\}]\times\{(W6/L6)/(W1/L1)\}\times(R7/R3)+(\delta(VF)/\delta T) \quad (1)$$

wherein k represents Boltzmann constant and is $1.38\times e^{-23}$ [J/K];

q represents the quantity of electric charges of electron in a simple form (elementary electric charge) and is $1.6\times e^{-19}$ [C];

T represents absolute temperature;

W1, W2, W4, W5, and W6 respectively represent the channel widths of the transistors 1, 2, 4, 5, and 6;

L1, L2, L4, L5, and L6 respectively represent the channel lengths of the transistors 1, 2, 4, 5, and 6; and k/q is a constant;

R3 represents the resistance value of the resistor 3;

R7 represents the resistance value of the resistor 7; and

VF represents the forward voltage of the diode 8.

This equation (1) shows that the temperature dependency $\delta(VF)/\delta T$ of the forward voltage VF of the diode 8 usually has a negative value, and the temperature dependency $\delta(REF)/\delta T$ of the output voltage REF can be set by the ratio of the resistance value R7 of the resistor 7 to the resistance value R3 of the resistor 3, i.e., R7/R3. That is, what is required for imparting temperature dependency to the REF level is only to set the resistance value ratio R7/R3.

The write regulator circuit 520 comprises a differential amplifier 9, a P-type transistor 10, and a resistor 11. The output voltage REF of the band gap circuit 510 is input into a (−) input terminal of the differential amplifier 9, and a voltage Sref of a split terminal (split by a resistor R10 and a resistor R11) of the resistor 11 is input into a (+) input terminal. The gate of the P-type transistor 10 is connected to the output terminal of the differential amplifier 9, and the resistor 11 is connected between the drain and the ground. The source of the P-type transistor 10 is connected to a power line. The differential amplifier 9 compares the REF value input into the (−) input terminal with the Sref value input into the (+) input terminal.

In the write mode, the OUT level of the write regulator 520 is determined by equation (2) based on the ratio of split by the resistance values R10, R11 of the resistor 11:

$$OUT=\{(R10+R11)/R10\}\times REF \quad (2)$$

Since, as described above, the REF level output from the band gap circuit 510 has been set so as not to have temperature dependence, the OUT level of the write regulator 520 is also set so as not to have temperature dependence.

In the verify mode, after writing (including writing after erase), write verification is carried out to judge whether or not information was correctly written. The memory cell of the nonvolatile memory is a kind of MOS (metal oxide semiconductor transistor) and thus is generally characterized in that the threshold voltage is high at low temperatures and decreases with raising the temperature. Therefore, in the verification after writing, setting in such a manner that the verify level is high at low temperatures and decreases with raising the temperature can realize advantageous verification because this setting conforms to the temperature characteristics of the threshold value of the memory cell. For this reason, a circuit is desired wherein the verify level decreases with raising the temperature.

The verify level having such temperature characteristics can be provided by adopting a reference voltage generator circuit having a construction shown in FIG. 2B described later wherein a reference voltage is generated in a band gap circuit having temperature dependence to provide a level necessary for the verify regulator circuit.

FIG. 2A is a schematic diagram showing the construction of a conventional reference voltage generator circuit for writing which is provided with a band gap circuit and a write regulator circuit, and FIG. 2B a schematic diagram showing the construction of a conventional reference voltage generator circuit for verification which is provided with a band gap circuit and a write regulator circuit.

Specifically, FIG. 2A shows a reference voltage generator circuit 601 for writing. The reference voltage generator circuit 601 for writing comprises a temperature-independent band gap (BGR) circuit 611 and a regulator circuit 612 for writing connected to the band gap circuit 611. A write reference voltage is output from the regulator circuit 612. Since the band gap circuit 611 does not have temperature dependence, the write reference voltage does not have temperature dependence.

FIG. 2B shows a verify reference voltage generator circuit 602. The verify reference voltage generator circuit 602 comprises a temperature-dependent band gap (BGR) circuit 611 and a verify regulator circuit 622 connected to the band gap circuit 621. A verify reference voltage is output from the regulator circuit 622. The band gap circuit 621 is set so that the output level has temperature dependence, that is, the output level decreases with raising the temperature. Therefore, the input of the verify regulator circuit 622 (output of the band gap circuit) changes upon a change in temperature, and this causes a change in the output level of the verify regulator circuit 622.

FIG. 3 shows the relationship between the output level of the write regulator circuit 612 shown in FIG. 2A and the temperature.

As described above, since the band gap circuit 611 does not have temperature dependence, the output voltage is constant independently of the temperature change (FIG. 3). Since the band gap circuit 611 does not have temperature dependence, the output level of the write regulator circuit 612 is also constant independently of the temperature change. Therefore, a constant level of voltage can be supplied to the drain and the gate independently of temperature environment under which the nonvolatile memory (memory cell) is placed. This enables writing to be carried out independently of the temperature.

FIG. 4 shows the relationship between the output level of the verify regulator circuit 622 shown in FIG. 2B and the temperature.

As is apparent from FIG. 4, since the band gap circuit 621 is set so that the output level has temperature dependence, the output level of the verify regulator circuit 622 varies depending upon the temperature, that is, the output level decreases with raising the temperature. Thus, by virtue of an advantage that a verify level according to the temperature characteristics of the threshold value of the memory cell can be obtained, advantageous conditions can be provided in the verification after writing.

In FIGS. 2A and 2B, the circuit construction of the write band gap circuit 611 is identical to that of the verify band gap circuit 621, and the circuit construction of the write regulator circuit 612 is identical to that of the verify regulator circuit 622. In this case, in order that the variation in the output level of the verify regulator circuit 622 is rendered identical to that of the level according to the temperature characteristics of the threshold value of the memory cell, the following measure is taken.

The temperature dependency $\delta(REF)/\delta T$ of REF of the verify band gap circuit 621 is determined by the resistance values R7, R3 of the respective resistors 7, 3, the channel ratio [width/length=W/L], and the forward voltage VF of the diode 8, and is expressed by equation (3):

$$\delta(REF)/\delta T = (k/q) \times ln[\{(W4/L4) \times (W2/L2)\}/\{(W1/L1) \times (W5/L5)\}] \times \{(W6/L6) \times (W1/L1)\} \times (R7/R3) + \delta(VF)/\delta T \quad (3)$$

This equation (3) shows that the temperature dependency $\delta(VF)/\delta T$ of the forward voltage VF of the diode 8 usually has a negative value, and the temperature dependency $\delta(REF)/\delta T$ of REF can be set by the ratio of the resistance value R7 of the resistor 7 to the resistance value R3 of the resistor 3 shown in FIG. 1, i.e., R7/R3. That is, temperature dependence, such that the level is high at low temperatures and is low at high temperatures, can be imparted to the REF level through setting of the resistance values of the resistors 7 and 3.

In FIG. 1, the output (OUT) level of the write regulator 520 in the write mode is determined by equation (4) based on the split ratio of the resistance values R10, R11 of the resistor 11:

$$OUT = \{(R10+R11)/R10\} \times REF \quad (4)$$

Thus, a level necessary for verification can be obtained by the resistance value R10 and the resistance value 11 of the resistor 11. Further, since the temperature dependence of the REF level has been set so that the level is high at low temperatures and low at high temperatures, the temperature dependence of the output (OUT) level of the verify regulator is also such that the level is high at low temperatures and low at high temperatures.

Thus, in writing and verification, in order to provide write level and verify level which are different from each other in temperature dependence, two band gap circuits, i.e., a write band gap circuit and a verify band gap circuit, should be provided.

Japanese patent Laid-Open No. 154397/1999 discloses a prior art technique satisfying equation (3). According to this technique, the temperature dependence is rendered identical to that of the threshold voltage of the memory cell, and the output level is set so as to be high at low temperatures and low at high temperatures, whereby a lowering in read speed of the memory cell at low temperatures is reduced.

The reference voltage generator circuit of the conventional nonvolatile memory, however, suffers from the following problems.

(1) The band gap circuit has an analog construction, and a number of small MOS transistors are combined for accuracy improvement purposes, thereby suppressing the influence of a variation in threshold value of MOS transistors within a semiconductor wafer. For this reason, the layout area of one band gap circuit is large. In recent years, from the viewpoint of reducing the cost of IC (integrated circuit), there is an increasing tendency toward the development of techniques which have focused on a reduction in layout area. The large layout area of the band gap circuit obstructs this.

(2) In order to satisfy the requirement that, at the time of writing (erasing), the drain voltage and the gate voltage of the memory cell do not have temperature dependence and are always on a constant level so that the write characteristics are not dependent upon the temperature while, after writing (after erasing), a verify level according to the temperature characteristics of the threshold value of the memory cell is provided to ensure the margin in the verification, two band gap circuits, i.e., a band gap circuit for writing (erasing) and a band gap circuit for verification, should be provided. The provision of the two band gap circuits, however, further increases the layout area. This problem is also involved in the technique disclosed in Japanese patent Laid-Open No. 154397/1999.

SUMMARY OF THE INVENTION

Accordingly, it is an object of the invention to provide a reference voltage generator circuit for a nonvolatile memory which can realize temperature characteristics according to each mode while reducing the layout area by a level correction regulator circuit and a single band gap circuit.

According to the first feature of the invention, there is provided a reference voltage generator circuit for a nonvolatile memory, adapted for setting and applying a write voltage or an erase voltage and, in addition, a verify voltage to the gate of a memory cell according respectively to a write/erase mode and a verify/read mode of the nonvolatile memory, said reference voltage generator circuit comprising:

a band gap circuit for generating an output voltage according to the temperature characteristics of each of the modes and, in addition, switching the temperature characteristics for each mode; and a level correction regulator circuit for generating a reference voltage for each of the modes based on the output voltage of the band gap circuit.

According to this construction, the band gap circuit generates an output voltage having temperature-output voltage characteristics corresponding to write/erase mode and an output voltage having temperature-output voltage characteristics corresponding to verify/read mode, and one of the output voltages is selected and output according to the modes. The output level of the selected output voltage is corrected for each mode by the level correction regulator circuit, and is then used as a reference voltage. Thus, since each reference voltage of the write/erase mode and the verify/read mode can be generated by one band gap circuit and one level correction regulator circuit, temperature characteristics according to each mode can be realized while reducing the layout area.

BRIEF DESCRIPTION OF THE DRAWINGS

The invention will be explained in more detail in conjunction with the appended drawings, wherein.

DESCRIPTION OF THE PREFERRED EMBODIMENTS

Preferred embodiments of the invention will be explained in conjunction with the accompanying drawings.

[First preferred embodiment]

Figure 1:
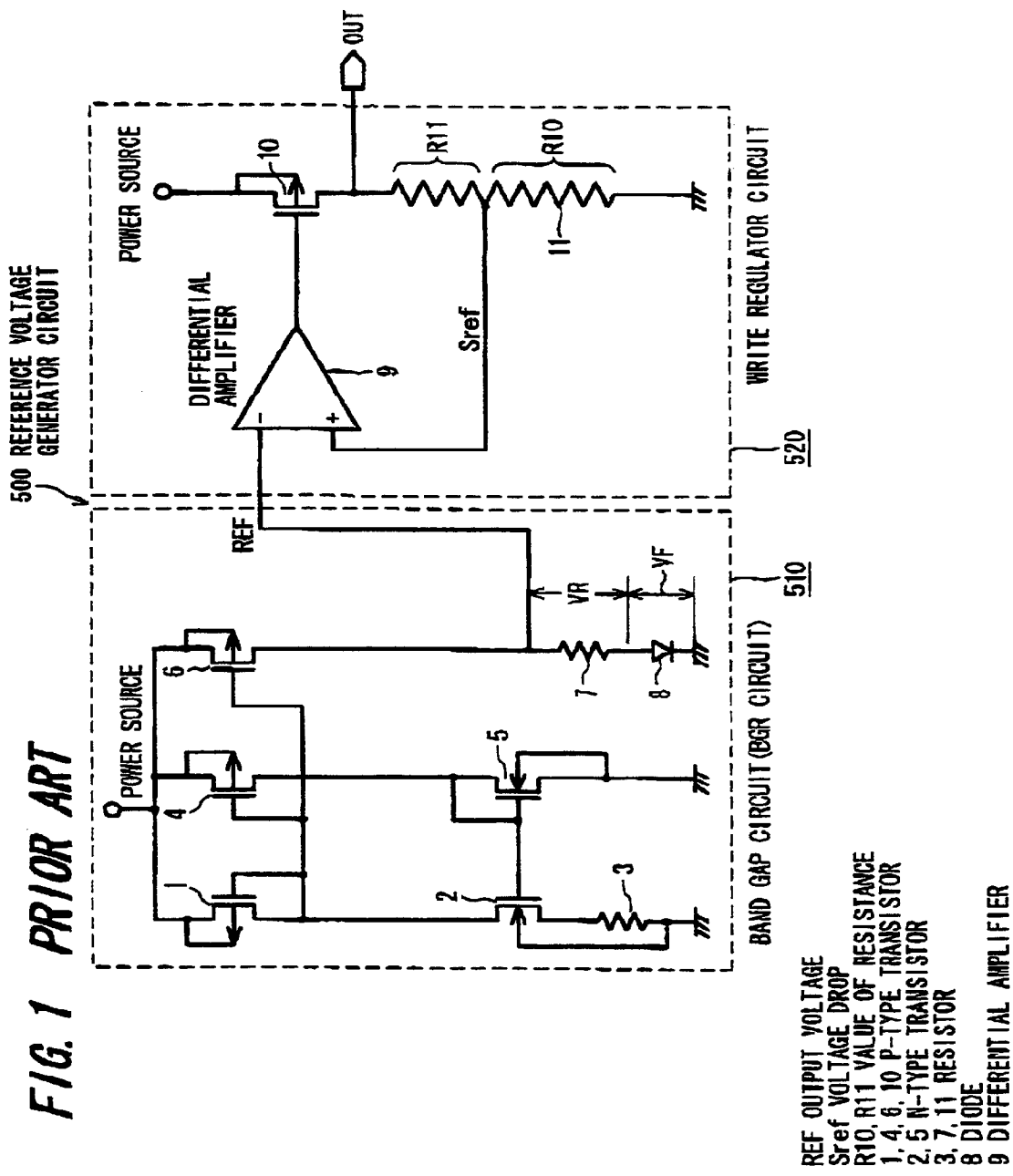
FIG. 1 is a circuit diagram showing a conventional reference voltage generator circuit for a nonvolatile memory.
Figures 2A, 2B:
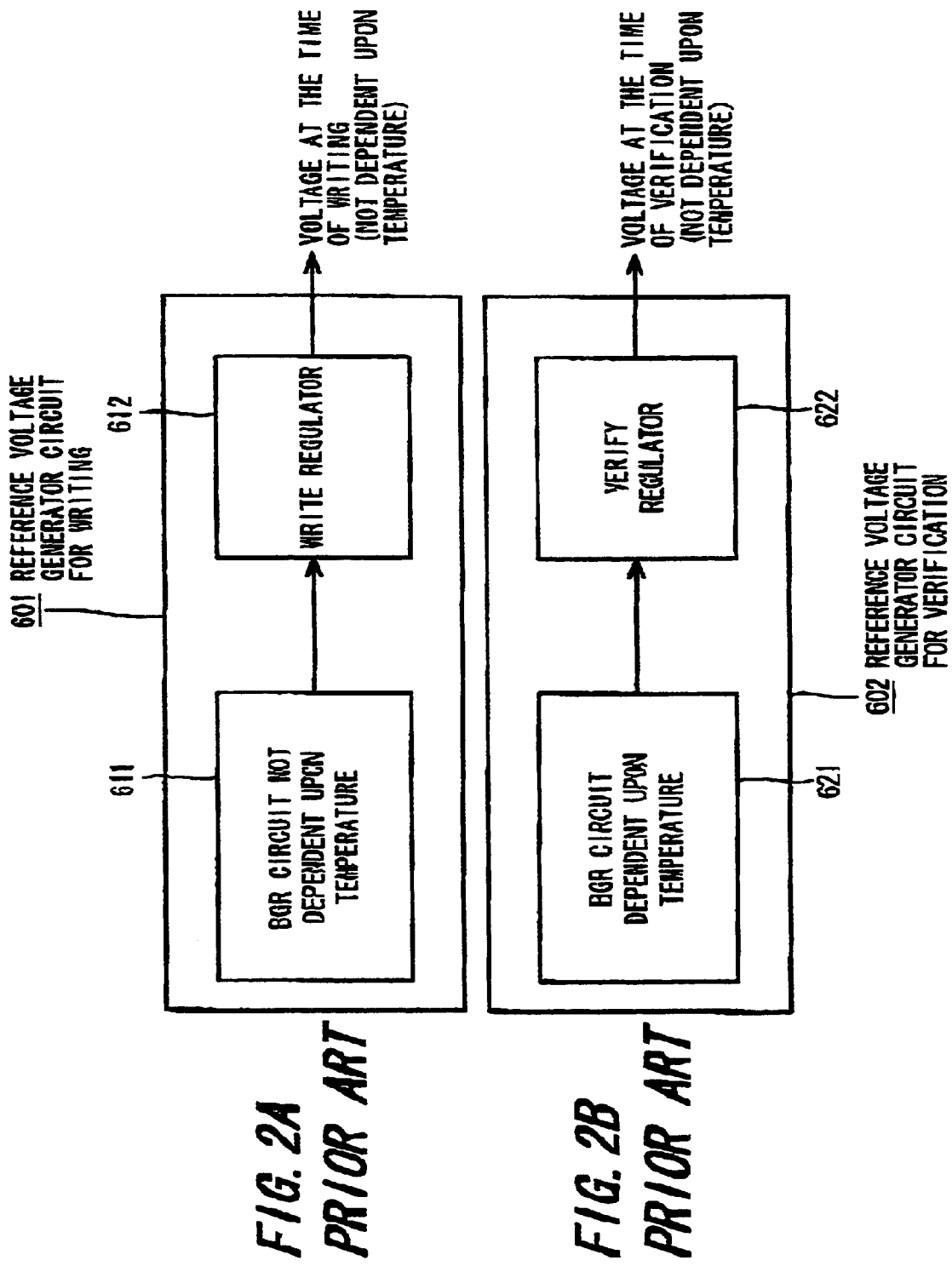
FIG. 2A is a schematic block diagram showing the construction of a conventional reference voltage generator circuit for writing which is provided with a band gap circuit and a write regulator circuit, and FIG. 2B a schematic block diagram showing the construction of a conventional reference voltage generator circuit for verification which is provided with a band gap circuit and a write regulator circuit.
Figure 3:
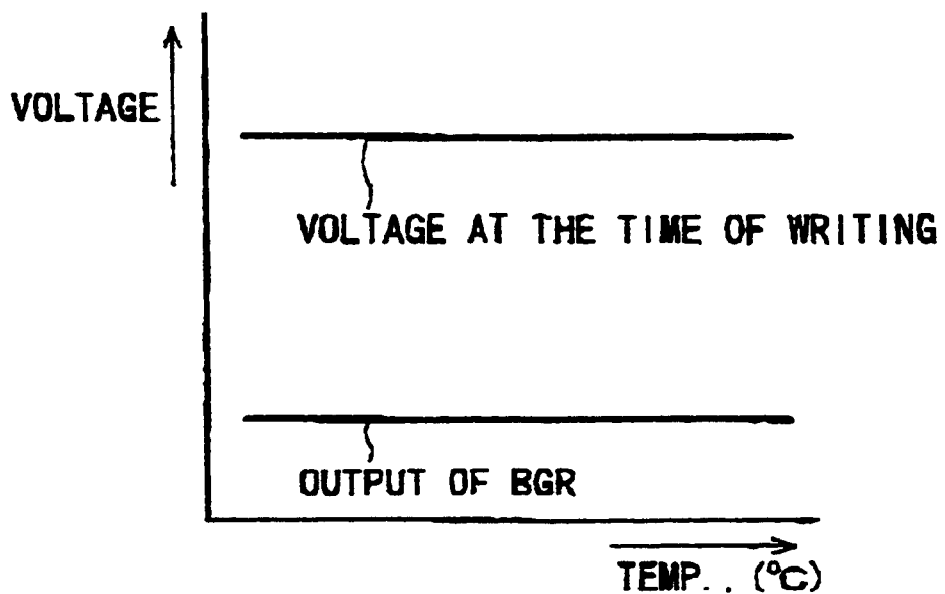
FIG. 3 is a voltage-temperature characteristic diagram showing the relationship between the output level of the write regulator circuit shown in FIG. 2A and the temperature.
Figure 4:
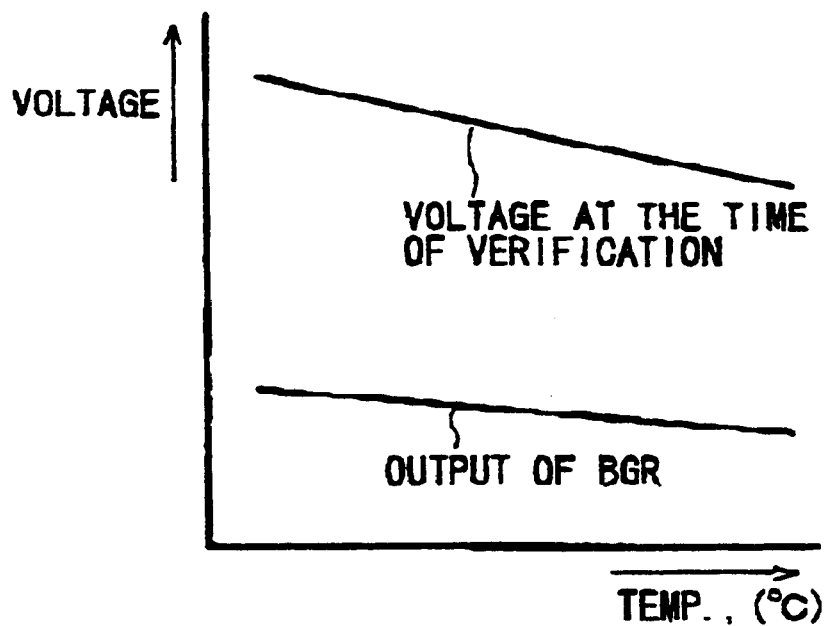
FIG. 4 is a voltage-temperature characteristic diagram showing the relationship between the output level of the verify regulator circuit shown in FIG. 2B and the temperature.
Figure 5:
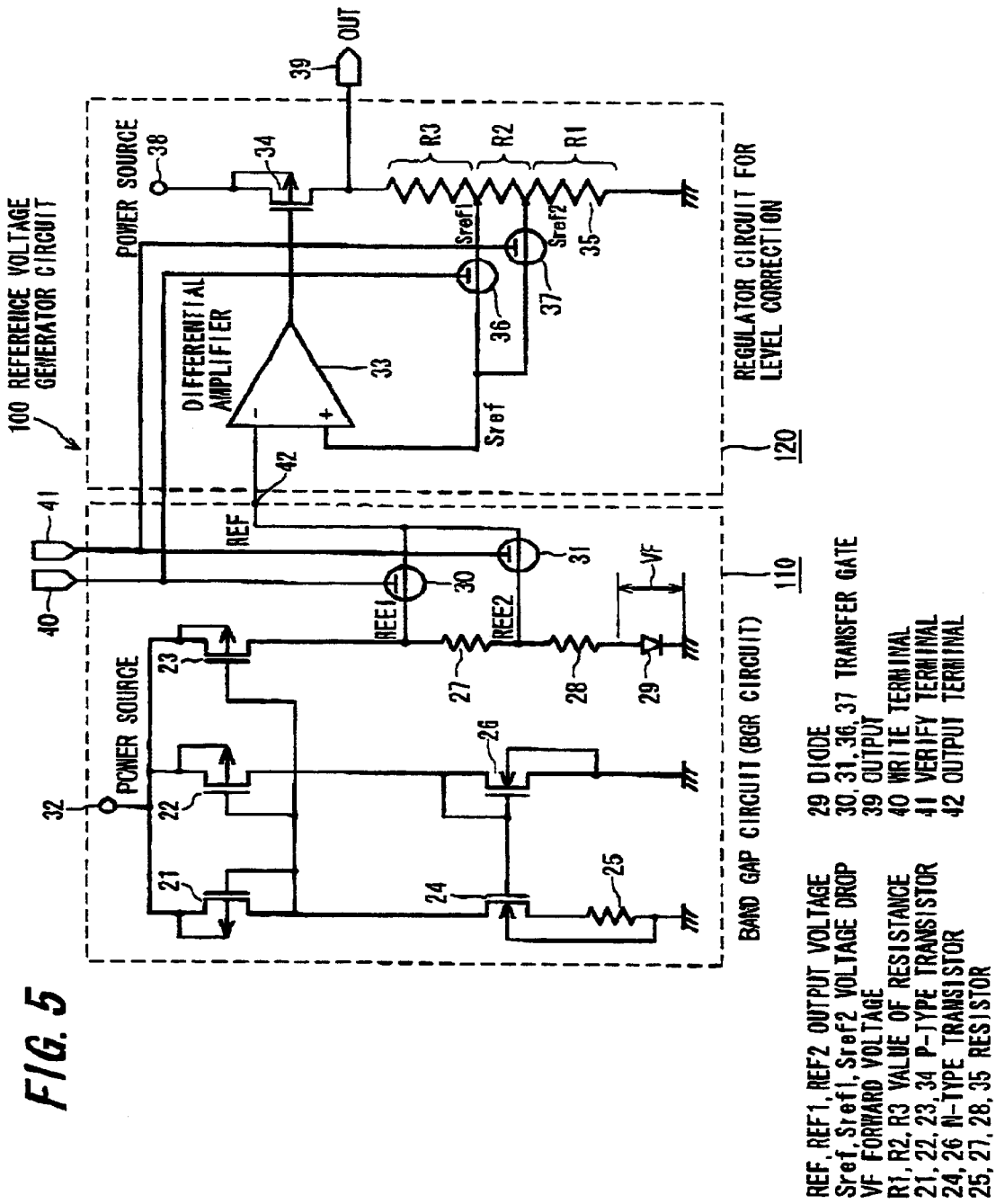
FIG. 5 is a circuit diagram showing a reference voltage generator circuit for a nonvolatile memory according to a preferred embodiment of the invention.

FIG. 5 shows a reference voltage generator circuit for a nonvolatile memory according to the invention.

A reference voltage generator circuit 100 according to the invention comprises a band gap (BGR) circuit 110 and a level correction regulator circuit 120 connected to the band gap circuit 110.

Since the level of the output voltage REF output from the band gap circuit 110 varies from mode to mode (write mode, verify mode), regulation is carried out by the level correction regulator circuit 120. For example, in order to provide an identical level for each mode at a temperature of 25° C., the resistance ratio for outputting Sref of the resistor 35 in the level correction regulator circuit 120 is varied for each mode in the transfer gates 36, 37 to regulate the output level and to generate output voltage OUT (reference voltage).

In the band gap circuit 110, each source of the P-type transistors 21, 22, 23 is connected to a power line 32. The gate and the drain of the P-type transistor 21 are commonly bonded, and this portion is connected to the drain of the N-type transistor 24. The gate of the P-type transistor 22 is connected to the drain of the P-type transistor 21, and the drain of the P-type transistor 22 is connected to the drain of the N-type transistor 26. The P-type transistor 23 in its gate is connected to the drain of the P-type transistor 21. A constant current inversely proportional to the resistance value of the resistor 25 is output from the drain. The P-type transistors 21, 22, 23 are connected to the drain of the N-type transistor 24 is such a state that the gates of these transistors are connected parallel to one another. The source of the N-type transistor 24 is grounded through the resistor 25, and the gate of the N-type transistor 24 is connected to the gate of the N-type transistor 26. The source of the N-type transistor 26 is grounded, and the drain and the gate of the N-type transistor 26 each are directly connected to each other. A circuit composed of resistors 27, 28 and a diode 29, which are connected in series, is connected between the drain of the P-type transistor 23 and the ground. A transfer gate 30 as a switch is connected between the high potential side (REF 1) of the resistor 27 and an output terminal 42, and is turned on/off according to the voltage applied to a WRITE terminal 40. A transfer gate 31 is connected between the connection point (REF 2) of the transistors 27, 28 and an output terminal 42, and is turned on/off according to the voltage applied to a verify terminal 41. An output voltage REF is output from the output terminal 42. Substrate electrodes of the transistors 21, 22, 23 are connected respectively to the drains of the transistors 21, 22, 23. The substrate electrode of the transistor 24 is grounded, and the substrate electrode of the transistor 26 is connected to the source of the transistor 26.

The level correction regulator circuit 120 is composed mainly of a differential amplifier 33. The output voltage REF of the band gap circuit 110 is input into a (−) input terminal, and the gate of a P-type transistor 34 is connected to the output terminal of the level correction regulator circuit 120. A resistor 35 is connected between the drain of the P-type transistor 34 and the ground. The source of the P-type transistor 34 is connected to a power line 38 and a substrate electrode. The resistor 35 is split into three parts respectively having resistance values R1, R2, R3, and two split points (take-out positions) are provided at respective boundaries, and a voltage Sref 1 and a voltage Sref 2 are output respectively from the two split points. A transfer gate 36 is connected between the split point, from which the voltage Sref 1 is output, and the diffraction amplifier 33 in its (+) input terminal. A transfer gate 37 is connected between the split point, from which the voltage Sref 2 is output, and the (+) input terminal of the differential amplifier 33. The control terminal of the transfer gate 36 is connected to the WRITE terminal 40, and the control terminal of the transfer gate 37 is connected to the verify terminal 41. The differential amplifier 33 compares the REF value and the Sref value input respectively into two input terminals, and outputs an output voltage OUT according to the comparison result.

Next, the operation of the reference voltage generator circuit 100 having the above construction will be briefly explained.

The internal resistor of the band gap circuit 110 is split into two parts, i.e., the resistor 27 and the resistor 28. The transfer gates 30, 31 are connected respectively to the connection points, and are driven according to the WRITE mode and the verify mode to vary the output level of the band gap circuit 110. This construction causes a change in temperature dependence of the output level of the band gap circuit 110. Since the output level of the band gap circuit 110 varies from mode to mode (WRITE mode, verify mode), regulation should be carried out by the level correction regulator 120. For example, the resistance ratio of the resistor 35 is changed so that an identical output level is provided at a temperature of 25° C. independently of the mode. This change is carried out by switching between the transfer gate 36 connected to the output point of the voltage Sref 1 and the transfer gate 37 connected to the output point of the voltage Sref 2 upon a change from the WRITE mode to the verify mode or vice versa. Thus, the output level of the regulator level correction regulator 120 is regulated.

Next, the operation of the reference voltage generator circuit shown in FIG. 5 will be explained in detail.

In the band gap circuit 110, a circuit, which starts from the P-type transistor 23 and ends with the diode, constitutes a constant-current circuit. In this constant-current circuit, a constant circuit is output from the drain of the P-type transistor 23. The constant current value is inversely proportional to the resistance value of the resistor 25. The transfer gate to be selected is determined by whether the mode in the nonvolatile memory is the WRITE mode or the verify mode. Specifically, in WRITE mode, the transfer gate 30 is selected, and, in this case, the level of REF 1 (high potential side output of the resistor 27) is output as REF. On the other hand, at the time of verification, the transfer gate 31 is selected, and the level of REF 2 (output of the point of connection between the resistor 27 and the resistor 28) is output as REF.

In the band gap circuit 110, the constant current, which flows into the constant-current circuit, is inversely proportional to the resistance value of the resistor 25. For this reason, voltage drop, which is proportional to the resistance values of the resistors 27, 28 and is inversely proportional to the resistance value of the resistor 25, that is, voltage drop determined by the resistance ratio {(resistance value of resistor 27+resistance value of resistor 28)/resistance value of resistor 25}, occurs in the resistors 27, 28, and the sum of the voltage value VR and the forward voltage VF of the diode 29 is output as an output voltage REF 1.

The temperature dependence δ(REF 1)/δT of the output voltage REF 1 is determined by resistance values R28, R27, and R25 of respective resistor 28, resistor 27, and resistor 25, each ratio [channel width/channel length=W/L] in the transistors 21, 22, 23, 24, 26, and the forward voltage VF of the diode 29, and is expressed by equation (5):

$$\delta(REF1)/\delta T = (k/q) \times ln[\{(W22/L22) \times (W24/L24)\}/\{(W21/L21) \times (W26/L26)\}] \times \{(W23/L23)/(W21/L21)\} \times \{(R28+R27)/R25\} + \delta(VF)/\delta T \quad (5)$$

wherein

W21 to W24 and W26 respectively represent channel widths of the transistors 21 to 24 and 26;

L21 to L24 and L26 respectively represent channel lengths of the transistors 21 to 24 and 26; and k/q is a constant.

This equation (5) shows that the temperature dependence δ(VF)/δT of the forward voltage VF in the diode 29 generally has a negative value, and the temperature dependence δ(REF1)/δT of REF 1 can be set by the resistance value ratio {(R28+R27)/R25} of the resistors 28, 27, and 25. That is, setting of each resistance value of the resistors 27, 28, 25 can render the level of REF 1 temperature-independent.

On the other hand, regarding the level of the REF 2, a constant current supplied to the series circuit composed of the resistor 28 and the diode 29 is inversely proportional to the resistance value of the resistor 25. For this reason, a voltage drop which is proportional to the resistance value of the resistor 28 and is inversely proportional to the resistance value of the resistor 25, that is, a drop voltage which can be set by the resistance value ratio (resistance value of resistor 28/resistor value of resistor 25) of the resistors 28 and 25, occurs in the resistor 28, and the sum of the drop voltage and the forward voltage VF of the diode 29 is output as REF 2 through the transfer gate 31.

The temperature dependence δ(REF 2)/δT of REF 2 is determined by resistance values R28 and R25 of respective resistor 28 and resistor 25, each ratio [channel width/channel length=W/L] in the transistors 21 to 24 and 26, and the forward voltage VF of the diode 29, and is expressed by the equation (6):

$$\delta(REF\ 2)/\delta T = (k/q) \times ln[\{(W22/L22) \times (W24/L24)\}/\{(W21/L21) \times (W25/L25)\}] \times \{(W23/L23)/(W21/L21)\} \times (R28/R25) + \delta(VF)/\delta T \quad (6)$$

This equation (6) shows that the temperature dependence δ(VF)/δT of the forward voltage VF in the diode 29 generally has a negative value, and the temperature dependence δ(REF2)/δT of REF 2 can be set by the resistance value ratio (R28/R25) of the resistors 28 and 25. That is, setting of the resistors 28 and 25 can render the level of REF 2 temperature-dependent so that the level is high at low temperatures and low at high temperatures.

As described above, the selection of REF 1 or REF 2 depends upon the selection of the transfer gate 30 or the transfer gate 31, and the REF level as the final output varies according to this selection. At the same time, the temperature dependence of the REF level also varies according to the selection. Since the output (REF) level of the band gap circuit 110 varies depending upon whether the mode is WRITE mode or verify mode, the regulation is once carried out by the level correction regulator circuit 120.

in the WRITE mode, the transfer gate 36 of the level correction regulator circuit 120 is driven. Further, in the band gap circuit 110, the transfer gate 30 is selected. In this case, the output (OUT) level of the level correction regulator circuit 120 is determined by resistance values R1 to R3 of resistor parts into which the resistor 35 has been split, and is expressed by formula (7):

$$OUT=\{(R1+R2+R3)/(R1+R2)\} \times REF\ 1 \qquad (7)$$

At the time of verification, in the level correction regulator circuit 120, the transfer gate 37 is selected. Further, in the band gap circuit 110, the transfer gate 31 is selected. For this reason, the output (OUT) level of the level correction regulator circuit 120 is determined by equation (8) based on the resistance values R1 to R3 of resistor parts into which the transistor 35 has been split:

$$OUT=\{(R1+R2+R3)/(R1+R2)\} \times REF\ 2 \qquad (8)$$

As described above, the selection of the transfer gates 30, 31 in the band gap circuit 110 and the selection of the transfer gates 36, 37 in the level correction regulator circuit 120 are interlocked, and, regarding the difference between REF 1 level and REF 2 level respectively in the WRITE mode and the verify mode, the output (OUT) level (reference voltage) of the level correction regulator circuit 120 can be set so as to be identical in the two modes through the setting of the resistance ratio of the resistor 35 in the level correction regulator circuit 120 (selection of the output position of the voltage Sref 1 and the voltage Sref 2). For example, at 25° C. the output (OUT) level of the level correction regulator circuit 120 can be always made identical even when the mode is changed from the WRITE mode to the verify mode or vice versa.

Further, regarding the temperature characteristics of the output (OUT) level (=reference voltage) of the level correction regulator circuit 120, in the WRITE mode, since the REF 1 level does not have temperature dependence, the OUT level is constant independently of the temperature. Further, regarding the temperature characteristics of the OUT level of the level correction regulator circuit 120, at the time of verification, since REF 2 does not have temperature characteristics (the level is high at low temperatures and low at high temperatures), setting in such that the OUT level is high at low temperatures and decreases with raising the temperature.

Thus, when the output voltage OUT of the level correction regulator circuit 120 is used as the reference voltage source, for example, at 25° C., an identical value is obtained in both the WRITE mode and the verify mode. In the WRITE mode, however, independently of a change in temperature, the output (OUT) level of the level correction regulator circuit 120 is set to the same value as the OUT level at 25° C. In the verify mode, setting is made so that the OUT level is high at low temperatures and low at high temperatures.

Here the operation of the transfer gates 30, 36 in the WRITE mode and the verify mode will be explained.

In the WRITE mode, the voltage of the drain and the voltage of the gate of the memory cell should not have temperature dependence and should be on a constant level. Therefore, the operation in the WRITE mode is as follows.

A voltage on an "H" level is applied as a WRITE signal to the WRITE terminal 40 of the band gap circuit 110. This voltage application permits REF 1≅REF to be output from the band gap circuit 110. Here since the REF 1 does not have temperature dependence, the REF signal also does not have temperature dependence and is on a constant level. Simultaneously with the selection of the transfer gate 30, the transfer gate 36 in the level correction regulator circuit 120 is selected. This permits Sref 1 to be applied to the (+) input terminal of the differential amplifier 33 through the transfer gate 36, wherein Sref 1 becomes equal to Sref. Since the output (OUT) level of the level correction regulator circuit 120 also does not have temperature dependence, a constant level can be provided.

On the other hand, in the verify mode, an output level having temperature dependence is necessary. Specifically, what is required is that the verify level is high at low temperatures and low at high temperatures. To satisfy this requirement, a voltage on an "H" level is applied to the verify terminal 41 in the band gap circuit 110. To this end, the band gap circuit 110 selects the transfer gate 31 and renders REF 2 equal to REF. By virtue of this operation, the REF level is high at low temperatures and low at high temperatures. At the same time, in the level correction regulator circuit 120, interlocking with the selection of the transfer gate 31, the transfer gate 37 is selected, whereby Sref 2 becomes equal to Sref. The output (OUT) level of the level correction regulator circuit 120 is high at low temperatures and low at high temperatures according to the REF level.

Figure 6:
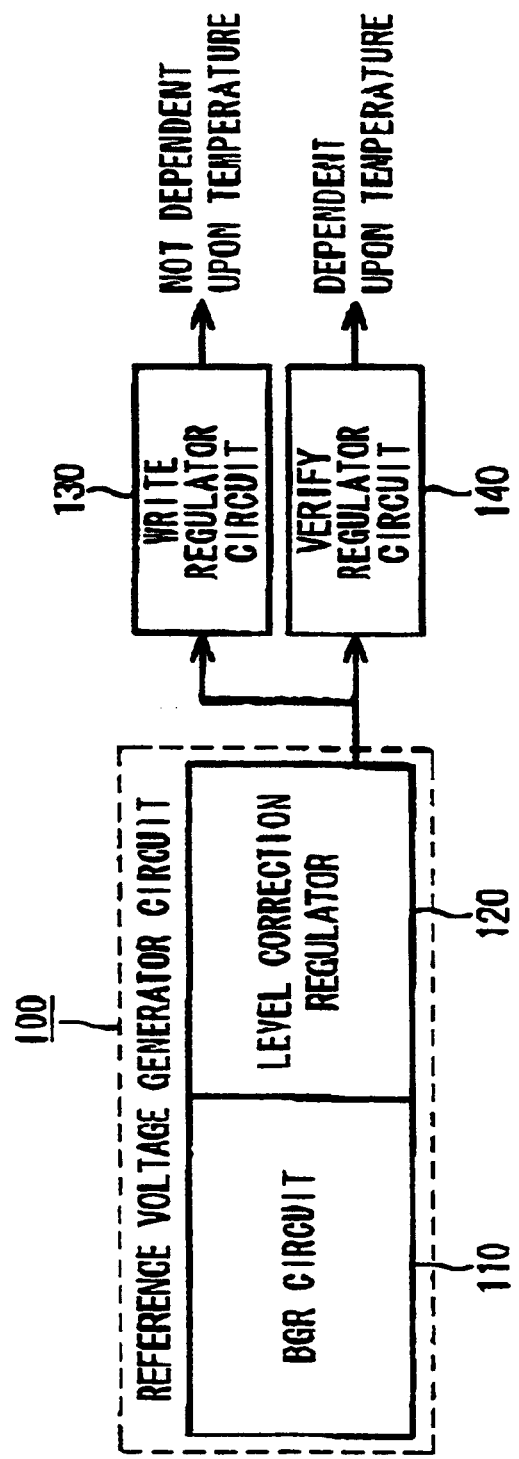
FIG. 6 is a block diagram showing a circuit for generating a temperature-independent write voltage and a temperature-dependent verify voltage through the utilization of a single band gap circuit and a single level correction regulator circuit.

FIG. 6 shows a circuit for generating a temperature-independent write voltage and a temperature-dependent verify voltage through the utilization of a single band gap circuit and a single level correction regulator circuit. According to this circuit construction, the output voltage (OUT) of the level correction regulator circuit 120 is used as a reference voltage source, and the reference voltage is applied to a write regulator circuit 130 and a verify regulator circuit 140. By virtue of this construction, the write level output from the write regulator circuit 130 does not have temperature dependence, and the verify level output from the verify regulator circuit 140 has temperature dependence.

Figure 7:
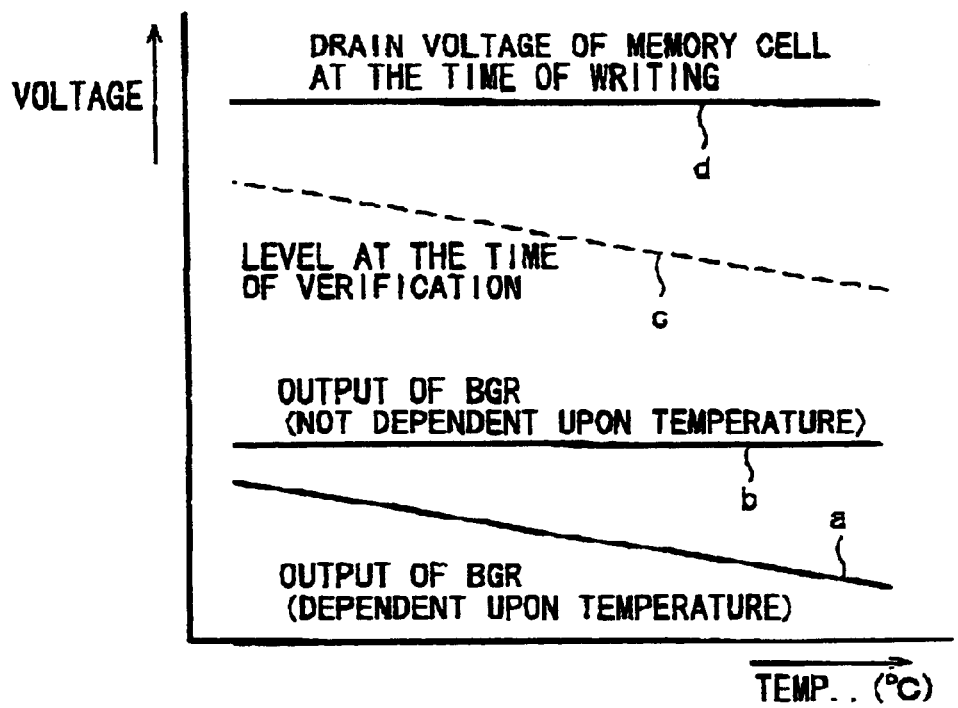
FIG. 7 is a voltage-temperature characteristic diagram showing the relationship between the output voltage level and the temperature for each circuit in the construction shown in FIG. 6.

FIG. 7 shows the relationship between the output voltage level and the temperature for each circuit in the construction shown in FIG. 6.

As is apparent from FIG. 7, in the write mode, in the band gap circuit 110, REF 2 is selected and setting is carried out so that REF has temperature dependence (characteristic a), whereby the write level output from the write regulator circuit 130 has temperature dependence (characteristic c). On the other hand, in the verify mode, in the band gap circuit 110, REF 1 is selected, and setting is carried out so that REF does not have temperature dependence (characteristic b), whereby the verify level output from the verify regulator circuit 140 does not have temperature dependence (characteristic d).

Thus, according to the above preferred embodiment, the number of band gap circuits as the reference voltage source at the time of writing (erasing) and verification can be reduced to one from two in the prior art technique. This can realize a reduction in layout area.

Further, in the verify mode, a verify level having more close temperature characteristics can be provided through the selection of the transfer gate in the output portion of the band gap circuit 110 and the transfer gate in the resistor portion of the voltage correction regulator circuit. This can closely keep up with temperature or other characteristics of the memory cell and thus can draw out the characteristics of the memory cell to the full.

An increasing tendency toward a reduction in size makes it difficult to satisfactorily draw out the characteristics of the memory cell. Further, a reduction in cost is also required. Satisfying these requirements was impossible in the prior art technique. According to the invention, however, the level according to writing (erasing) can be optimally generated, the level according to the verify mode can be optimally generated, the level according to the characteristics of the memory cell can be generated, and, in addition, the layout area can be reduced. Therefore, the above problems can be solved.

Next, other preferred embodiments of the invention will be explained.

[Second preferred embodiment]

Figure 8:
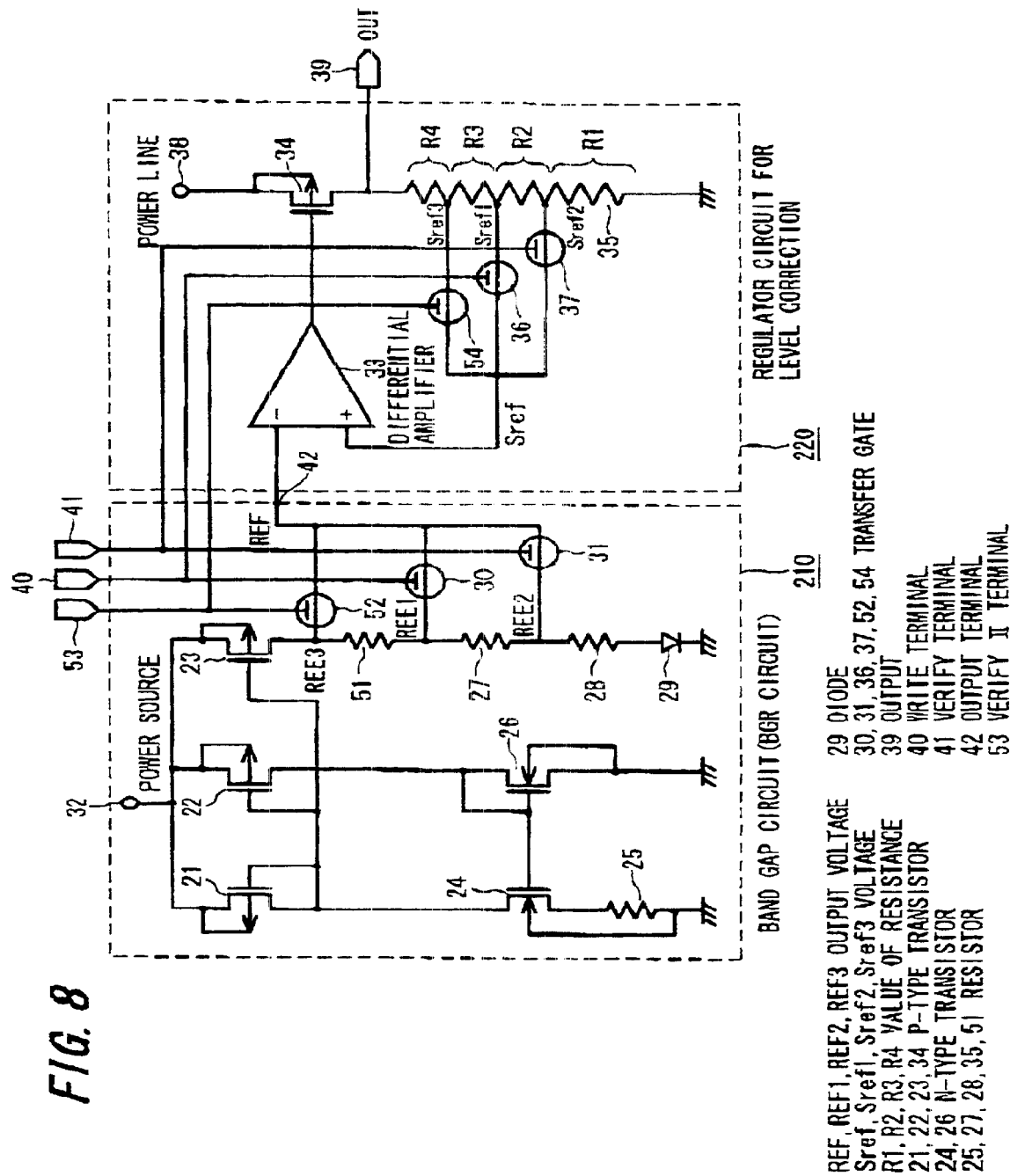
FIG. 8 is a circuit diagram showing a reference voltage generator circuit for a nonvolatile memory according to another preferred embodiment of the invention.

FIG. 8 shows another preferred embodiment of the invention. In FIGS. 8 and 5, like parts have the same reference numerals, and the explanation of overlapped portions will be omitted.

A band gap circuit 210 has the same construction as the band gap circuit 110 shown in FIG. 5, except that a resistor 51, which has been inserted between the source of the P-type transistor 23 and the resistor 27 and constructed so as for REF 3 to be output from the connection point, a transfer gate 52 provided between the connection point and the output terminal 42, and a verify II terminal 53 connected to the gate of the transfer gate 52 are additionally provided.

One of the transfer gates 30, 31, 52 is selected according to the WRITE mode, the verify mode, and the verify II mode in the nonvolatile memory. Specifically, in the WRITE mode, the transfer gate 30 is selected to output REF 1; in the verify mode, the transfer gate 31 is selected to output REF 2; and, in the verify II mode, the transfer gate 52 is selected to output REF 3.

The construction of the level correction regulator circuit 220 is such that a transfer gate 54 has been additionally provided in the level correction regulator circuit 120 shown in FIG. 5. Further, a resistance value R4 is newly set in the resistor 35 to provide a third split point from which Sref 3 is output. The transfer gate 54 is provided between this split point and the (+) input terminal of the differential amplifier 33, and is connected to the verify II terminal 53.

In the band gap circuit 210, a voltage drop VR determined by the ratio of the total resistance value of the resistors 51, 27, 28 to the resistance value of the resistors 25 {(R51+R27+R28)/R25)} occurs, and the sum of the voltage drop and the forward voltage VF of the diode 29 (VR+VF) is output as REF 3. The temperature dependence δ(REF 3)/δT of REF 3 is determined by resistance values R51, R27, R28, R25 of the respective resistors 51, 27, 28, 25, each ratio [channel width/channel length=W/L] in the transistors 21, 22, 23, 24, 26, and the forward voltage VF of the diode 29, and is expressed by equation (9):

$$\delta(REF\ 3)/\delta T=(k/q)\times ln[\{(W22/L22)\times(W24/L24)\}/\{(W21/L21)\times(W26/L26)\}]\times(W23/L23)/(W21/L21)\times(R28+R27+R51)/R25+\delta(VF)/\delta T \quad (9)$$

wherein

W21 to W24 and W26 respectively represent channel widths of the transistors 21 to 24 and 26; and L21 to L24 and L26 respectively represent channel lengths of the transistors 21 to 24 and 26.

This equation (9) shows that the temperature dependence δ(VF)/δT of the forward voltage VF in the diode 29 generally has a negative value, and the temperature dependence δ(REF 3)/δT of REF 3 can be set by the ratio of the total resistance value of the resistors 51, 27, 28 to the resistance value of the resistor 25 {(R51+R27+R28)/R25)}. That is, when the resistors 27, 28, 51, 25 are properly set, the level of REF 3 can have temperature dependence such that the level is low at low temperatures and high at high temperatures.

Thus, the output (REF) level of the band gap circuit can be varied on three levels by selecting REF 1, REF 2, and REF 3 in the band gap circuit 210 by the transfer gates 30, 31, 52 according to the WRITE mode, the verify mode, and the verify II mode. At the same time, the temperature dependence of the output (REF) level of the band gap circuit is also different. Since the WRITE mode, the verify mode, and the verify II mode are different from one another in the output level of the band gap circuit 210, regulation is carried out by the level correction regulator 220.

The level correction regulator circuit 220 receives REF from the band gap circuit 210, and the output voltage (OUT) of the level correction regulator 220 is set and generated based on this REF. When the mode is the verify II mode, the transfer gate 54 is selected. Further, in the band gap circuit 210, the transfer gate 52 is selected. Therefore, the output (OUT) level of the level correction regulator 220 is determined by resistance values R1, R2, R3, R4 of respective resistor parts into which the resistor 35 has been split at the split points, and is expressed by equation (10)

$$OUT=\{(R1+R2+R3+R4)/(R1+R2+R3)\}\times REF\ 3 \quad (10)$$

Thus, when the selection of the transfer gates 30, 31, 52 in the band gap circuit 210 is interlocked with the selection of the transfer gates 36, 37, 54 in the level correction regulator 220, although the levels of REF 1, REF 2, and REF 3 output according to the WRITE mode, the verify mode, and the verify II mode are different from one another, the output (OUT) level of the level correction regulator can be rendered identical in all the modes through optimal setting of the resistance values R1 to R4 of the resistor 35. For example, setting can be made in such a manner that, at 25° C., even upon a change in mode among the WRITE mode, the verify mode, and the verify II mode, the output (OUT) level of the level correction regulator 220 is always constant.

In the output (OUT) level of the level correction regulator 220, in the WRITE mode, since temperature dependence is not imparted to REF 1, the level is constant independently of the temperature. In the verify mode, since temperature dependence has been imparted to REF 2, the OUT level is high at low temperatures and decreases with raising the temperature. Further, in the verify II mode, since temperature dependence has been imparted to REF 3, the OUT level is low at low temperatures and increases with raising the temperature.

Thus, when the output (OUT) level of the level correction regulator circuit 220 is used as a reference voltage source, an identical output value is obtained in both the WRITE mode and the verify mode. In the WRITE mode, the output (OUT) level of the level correction regulator circuit 220 is set so as to be identical to the OUT level independently of the temperature. In the verify mode, setting is carried out in such a manner that the OUT level is high at low temperatures and decreases with raising the temperature. Further, in the verify II mode, setting is carried out in such a manner that the OUT level is low at low temperatures and increases with raising the temperature.

Next, the overall operation of the preferred embodiment shown in FIG. 8 will be explained.

In the WRITE mode, the voltage of the drain and the gate in the memory cell should not have temperature dependence and should be on a constant level. To this end, the following reference voltage is generated.

A voltage on an "H" level is applied to the WRITE terminal 40 of the band gap circuit 210, the transfer gate 30 in the band gap circuit 210 is selected, and REF 1 is rendered equal to REF. Since REF 1 does not have temperature dependence, the output REF also does not have temperature dependence and becomes a constant level. At the same time, since the voltage on an "H" level is also selected in the transfer gate 36 in the level correction regulator circuit 220, Sref 1=Sref is input into the (+) input terminal of the differential amplifier 33, and an output voltage OUT corresponding to Sref 1 is output. Since REF 1 does not have temperature dependence, the output (OUT) level of the level correction regulator circuit 220 also does not have temperature dependence and can be on a constant level.

Next, in the verify mode, an OUT level having temperature dependence is necessary. Accordingly, the reference voltage is generated as follows. A voltage on an "H" level is applied to the verify terminal 41 in the band gap circuit 210, the transfer gate 31 of the band gap circuit 210 is selected, and REF 2 is brought to REF. By virtue of this, high REF is generated at low temperatures, while low REF is generated at high temperatures. At the same time, a voltage on an "H" level is also applied to the transfer gate 37 in the level correction regulator circuit 220, and Sref 2 is brought to Sref. Therefore, an output voltage OUT corresponding to Sref 2 is output. Since REF 2 does not have temperature dependence, the output (OUT) level of the level correction regulator circuit 220 also does not have temperature dependence and can be on a constant level.

In the verify II mode, the output level of the level correction regulator circuit 220 should have temperature dependence. Accordingly, the following reference voltage is generated.

A voltage on an "H" level is applied to the verify II terminal in the band gap circuit 210 to select the transfer gate 52, and REF 3 is rendered equal to REF. REF 3 is low at low temperatures and is high at high temperatures, and, thus, REF also has the same characteristics. At the same time, since a voltage on an "H" level is also applied to the transfer gate 54 in the level correction regulator circuit 220, Sref 3 becomes equal to Sref. Therefore, an output voltage OUT corresponding to Sref 3 is output. At that time, since REF 3 has temperature dependence, the output (OUT) level of the level correction regulator circuit 220 is low at low temperatures and is high at high temperatures.

According to the above-described second preferred embodiment, the use of a single band gap circuit as a reference voltage source suffices for the case where the nonvolatile memory has three modes of the WRITE mode, the verify mode, and the verify II mode. Therefore, the layout area can be reduced. Further, as with the first preferred embodiment, the selection of the transfer gate in each circuit in an interlocked state can provide a fine verify level. This makes it possible to closely keep up with temperature or other characteristics of the memory cell and thus can satisfactorily draw out the characteristics of the memory cell.

In the above preferred embodiment, a transfer gate has been used in selection means and switch means. The invention, however, is not limited to this only, and other means, such as semiconductor switch elements and microrelay, may be used.

As is apparent from the foregoing description, according to the reference voltage generator circuit for a nonvolatile memory according to the invention, an output voltage having temperature-output voltage characteristics corresponding to write/erase mode and an output voltage having temperature-output voltage characteristics corresponding to verify/read mode are generated, and the reference voltage generator circuit comprises one band gap circuit, which selects and outputs one of the output voltages according to the mode, and one level correction regulator circuit which corrects the output level of the output voltage from the band gap circuit for each mode and uses this as a reference voltage. By virtue of this construction, the reference voltage of each of the write/erase mode and the verify/read mode can be generated by a circuit of minimum configuration, and, thus, temperature characteristics according to each mode can be realized while reducing the layout area.

The invention has been described in detail with particular reference to preferred embodiments, but it will be understood that variations and modifications can be effected within the scope of the invention as set forth in the appended claims.

What is claimed is:

1. A reference voltage generator circuit for a nonvolatile memory, adapted for setting and applying a write voltage or an erase voltage and, in addition, a verify voltage to the gate of a memory cell according respectively to a write/erase mode and a verify/read mode of the nonvolatile memory, said reference voltage generator circuit comprising:

a band gap circuit for generating an output voltage according to the temperature characteristics of each of the modes and, in addition, switching the temperature characteristics for each mode; and a level correction regulator circuit for generating a reference voltage for each of the modes based on the output voltage of the band gap circuit.

2. The reference voltage generator circuit for a nonvolatile memory according to claim 1, wherein the verify/read mode has two types of verify modes.

3. The reference voltage generator circuit for a nonvolatile memory according to claim 1, wherein the band gap circuit has temperature characteristics such that, in the verify/read mode, the output level is high at low temperatures and decreases with raising the temperature.

4. The reference voltage generator circuit for a nonvolatile memory according to claim 1, wherein the band gap circuit comprises:

a first resistor;

a drive circuit for allowing a constant current to flow into the first resistor;

a second resistor which has a resistance value of R2 and determines the temperature dependence based on the ratio of the resistance value R2 to the resistance value R1 of the first resistor, R2/R1;

a diode which is connected in series in a forward direction to the second resistor and generates a part of the output voltage;

a constant current circuit for allowing a constant current to flow into the series circuit comprising the second resistor and the diode and outputting an output voltage from the second resistor in its predetermined position; and switch means for dividing the second resistor at a predetermined resistance ratio, selecting the output at the split point in the verify/read mode, and selecting the high potential end output of the second resistor in the write/erase mode.

5. The reference voltage generator circuit for a nonvolatile memory according to claim 2, wherein said switch means comprises:
   a first transfer gate which is connected to the high potential end of the second resistor and is turned on in the write/erase mode; and
   a second transfer gate which is connected to the split point of the second resistor and is turned on in the verify/read mode.

6. The reference voltage generator circuit for a nonvolatile memory according to claim 5, wherein, in the band gap circuit, a third resistor for outputting an output voltage corresponding to a second verify/read mode is connected in series to the second resistor, and a third transfer gate for leading the output voltage of the third resistor to the output terminal is provided in the switch means.

7. The reference voltage generator circuit for a nonvolatile memory according to claim 1, wherein the level correction regulator circuit comprises:
   a differential amplifier which uses, as one input, the output voltage of the band gap circuit;
   a third resistor which is connected between the output stage of the differential amplifier and the ground and, in addition, has first and second resistor split points corresponding respectively to said two modes; and
   selection means which inputs one of the output voltages at the first and second resistor split points selected according to the write/erase mode and the verify/read mode into the other input terminal of the differential amplifier.

8. The reference voltage generator circuit for a nonvolatile memory according to claim 7, wherein said selection means comprises:
   a fourth transfer gate which is provided between the first resistor split point and the other input terminal of the differential amplifier and is turned on in the write/erase mode; and
   a fifth transfer gate which is provided between the second resistor split point and the other input terminal of the differential amplifier and is turned on in the verify/read mode.

9. The reference voltage generator circuit for a nonvolatile memory according to claim 8, wherein, in said level correction regulator circuit, the third resistor has a third resistor split point corresponding to the second verify/read mode, and said selection means has a sixth transfer gate which is provided between the third resistor split point and the other input terminal of the differential amplifier and is turned on in the verify/read mode.

* * * * *